(12) United States Patent
Inaba et al.

(10) Patent No.: US 11,677,210 B2
(45) Date of Patent: Jun. 13, 2023

(54) SEMICONDUCTOR LASER MODULE

(71) Applicant: FURUKAWA ELECTRIC CO., LTD., Tokyo (JP)

(72) Inventors: Yusuke Inaba, Tokyo (JP); Maiko Ariga, Tokyo (JP); Kazuki Yamaoka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 141 days.

(21) Appl. No.: 16/985,277

(22) Filed: Aug. 5, 2020

(65) Prior Publication Data
US 2020/0366056 A1 Nov. 19, 2020

Related U.S. Application Data

(63) Continuation of application No. PCT/JP2019/005457, filed on Feb. 14, 2019.

(30) Foreign Application Priority Data

Feb. 14, 2018 (JP) .............................. JP2018-024398

(51) Int. Cl.
*H01S 5/02251* (2021.01)
*H01S 5/02253* (2021.01)
*H01S 5/02326* (2021.01)

(52) U.S. Cl.
CPC ...... *H01S 5/02251* (2021.01); *H01S 5/02253* (2021.01); *H01S 5/02326* (2021.01)

(58) Field of Classification Search
CPC ............. H01S 5/02251; H01S 5/02253; H01S 5/02326; H01S 5/02325; H01S 5/0064;
(Continued)

(56) References Cited

U.S. PATENT DOCUMENTS

2003/0002050 A1\* 1/2003 Tatsuno ................ H01S 5/0687
356/519
2004/0101016 A1\* 5/2004 McDonald .......... H01S 5/02325
372/97
(Continued)

FOREIGN PATENT DOCUMENTS

JP 2-100213 U 8/1990
JP 7-104153 A 4/1995
(Continued)

OTHER PUBLICATIONS

International Search Report dated May 7, 2019 in PCT/JP2019/005457 filed Feb. 14, 2019, citing documents AA and AP-AS therein, 1 page.
(Continued)

*Primary Examiner* — Xinning(Tom) Niu
(74) *Attorney, Agent, or Firm* — Oblon, McClelland, Maier & Neustadt, L.L.P.

(57) ABSTRACT

A semiconductor laser module that includes a package accommodating therein a plurality of optical components, includes: a semiconductor laser device that emits laser light toward one end side in the package; an optical fiber having an incident end of the laser light on another end side in the package, the another end being in an opposite direction of an emission direction in which the semiconductor laser device emits the laser light; and a turn-back unit that turns back the laser light toward the another end side in the package, the another end being in the opposite direction of the emission direction in which the semiconductor laser device emits the laser light, and outputs the laser light to the incident end of the optical fiber.

15 Claims, 9 Drawing Sheets

(58) Field of Classification Search
CPC ............ H01S 5/02476; H01S 5/06837; H01S 5/0222; H01S 5/02438; H01S 5/0687; H01S 5/02208; H01S 5/02415
See application file for complete search history.

(56) References Cited

U.S. PATENT DOCUMENTS

| | | | |
|---|---|---|---|
| 2010/0074287 A1 | 3/2010 | Yamamoto | |
| 2012/0020379 A1* | 1/2012 | Muranushi | H01S 5/02325 372/34 |
| 2012/0127715 A1* | 5/2012 | Ariga | H01S 5/02251 362/293 |
| 2015/0008819 A1* | 1/2015 | Yu | H01L 51/524 313/504 |

FOREIGN PATENT DOCUMENTS

| | | |
|---|---|---|
| JP | 2002-343982 | 11/2002 |
| JP | 2005-99166 A | 4/2005 |
| JP | 2009-264975 | 11/2009 |
| JP | 2010-73774 A | 4/2010 |
| JP | 2010-239079 A | 10/2010 |
| JP | 2014-019726 | 2/2014 |

OTHER PUBLICATIONS

Chinese Office Action dated Dec. 14, 2022 in Chinese Application No. 201980013022.2 with English translation, citing document No. 15 therein, 23 pgs.

Japanese Office Action dated Jan. 17, 2023 in Japanese Application No. 2020-500570, with English Machine Translation, citing document Nos. 15 and 16, 5 pgs.

\* cited by examiner

SEMICONDUCTOR LASER MODULE

CROSS-REFERENCE TO RELATED APPLICATION(S)

This application is a continuation of International Application No. PCT/JP2019/005457, filed on Feb. 14, 2019 which claims the benefit of priority of the prior Japanese Patent Application No. 2018-024398, filed on Feb. 14, 2018, the entire contents of which are incorporated herein by reference.

BACKGROUND

The present disclosure relates to a semiconductor laser module.

In general, it is known that semiconductor laser modules have structures in which a plurality of optical components such as semiconductor laser devices are housed in their packages (e.g., refer to Japanese Laid-open Patent Publication No. 2005-99166).

SUMMARY

There is a need for providing a semiconductor laser module capable of downsizing the package in the long side direction.

According to an embodiment, a semiconductor laser module that includes a package accommodating therein a plurality of optical components, includes: a semiconductor laser device that emits laser light toward one end side in the package; an optical fiber having an incident end of the laser light on another end side in the package, the another end being in an opposite direction of an emission direction in which the semiconductor laser device emits the laser light; and a turn-back unit that turns back the laser light toward the another end side in the package, the another end being in the opposite direction of the emission direction in which the semiconductor laser device emits the laser light, and outputs the laser light to the incident end of the optical fiber.

DETAILED DESCRIPTION

In the related art, with an increase in number of optical components in the semiconductor laser modules, their package sizes in their long side directions increase. A problem, however, arises in that the package needs to be downsized as a conflicting request.

The following describes embodiments with reference to the accompanying drawings. The embodiments do not limit the present disclosure. Elements identical or corresponding to each other are provided with the same numeral appropriately in the respective drawings, and duplicated descriptions thereof are appropriately omitted. The drawings are schematic and attention needs to be paid that dimensional relations among the elements and ratios among the elements differ from those of actual ones in some cases, for example. Among the drawings, the dimensional relations and ratios among the elements also differ in some cases.

First Embodiment

Semiconductor Laser Module

Figure 1:
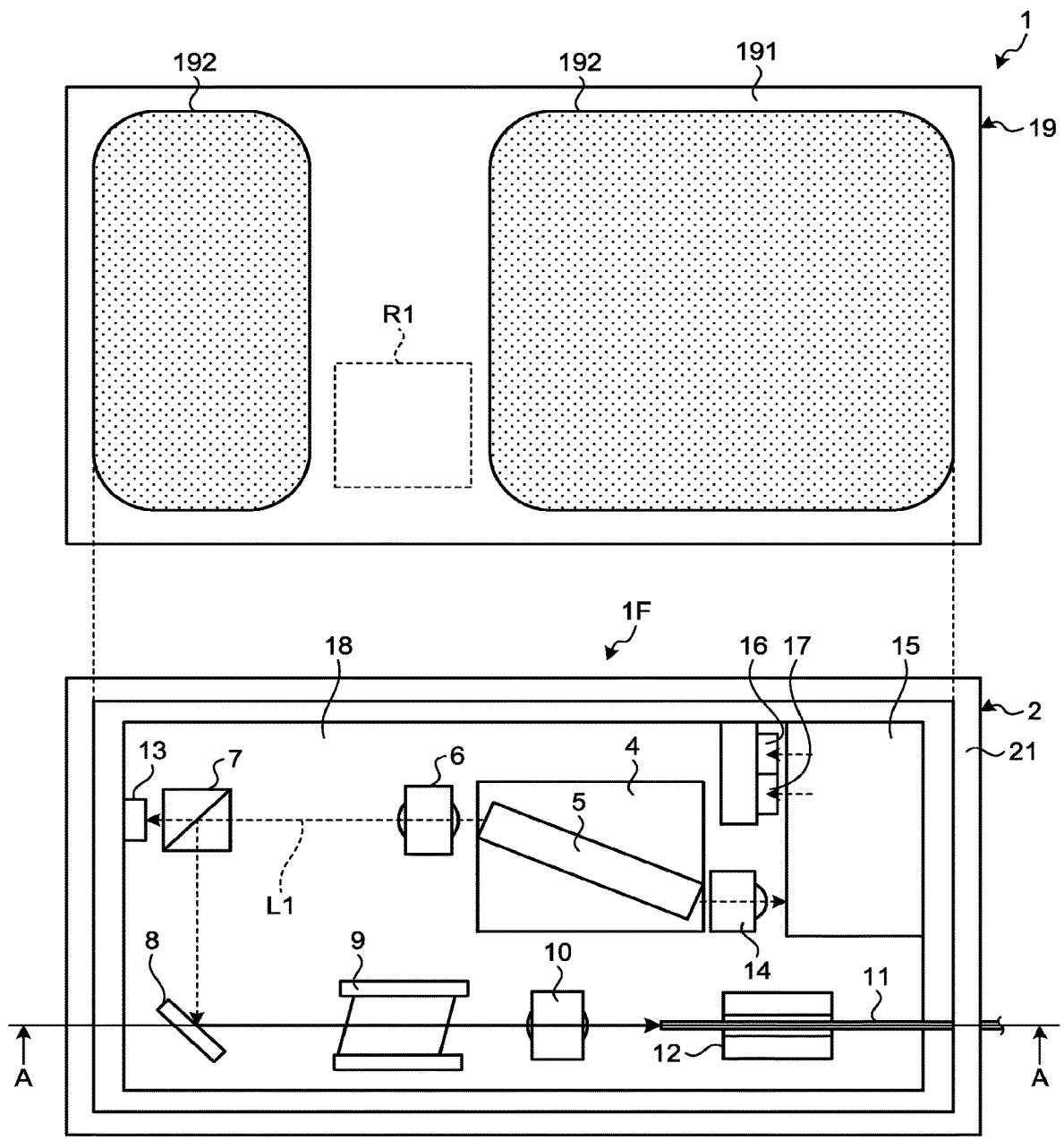
FIG. 1 is a plan view schematically illustrating a structure of a semiconductor laser module according to a first embodiment.
Figure 2:
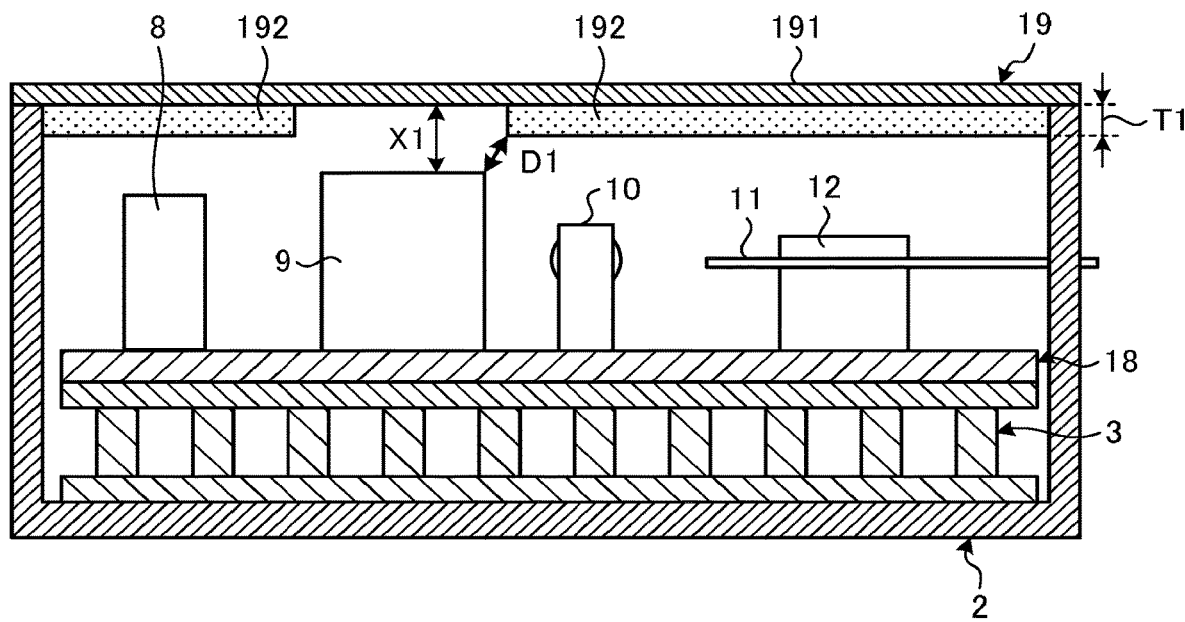
FIG. 2 is a cross-sectional view taken along line A-A in FIG. 1.

FIG. 1 is a plan view schematically illustrating a structure of a semiconductor laser module according to a first embodiment. FIG. 2 is a cross-sectional view taken along line A-A in FIG. 1.

This semiconductor laser module 1 illustrated in FIGS. 1 and 2 includes a package 2, a temperature regulator 3, a laser support member 4, which is also called a sub-mount, a semiconductor laser device 5, a collimating lens 6, a beam splitter 7, a mirror 8, an optical isolator 9, a condenser lens 10, an optical fiber 11, a fiber holder 12, a photo diode 13 (hereinafter, simply described as a "PD 13"), a coupling lens 14, a wavelength detection element 15, a photo diode 16 (hereinafter, simply described as a "PD 16"), a photo diode 17 (hereinafter, simply described as a "PD 17"), a support member 18, which is called a base, and a lid portion 19. FIGS. 1 and 2 illustrate the package 2 and the lid portion 19 in parallel with each other in a state where the lid portion 19 is removed from the package 2 for explaining an internal structure of the semiconductor laser module 1. The temperature regulator 3 and the support member 18 have substantially the same size when they are viewed from above. The temperature regulator 3 is, thus, not seen in FIG. 1.

The package 2 has a rectangular shape in a plan view and a side view. The package 2 houses therein the temperature regulator 3, the laser support member 4, the semiconductor laser device 5, the collimating lens 6, the beam splitter 7, the mirror 8, the optical isolator 9, the condenser lens 10, the optical fiber 11, the fiber holder 12, the PD 13, the coupling lens 14, the wavelength detection element 15, the PD 16, and the PD 17.

The temperature regulator 3 regulates respective temperatures of the semiconductor laser device 5 placed on the laser support member 4 and the wavelength detection element 15 in accordance with driving currents supplied from a controller (not illustrated) via electrodes (not illustrated). The temperature regulator 3 has a structure in which a plurality of columnar semiconductor devices (N type and P type semiconductor devices) stand vertically and are arranged two-dimensionally between substrates. In the temperature regulator 3, the upper ends and the lower ends of the respective N-type and P-type semiconductor devices are connected to the lower and the upper substrates by metallic electrodes, and the N-type and P-type semiconductor devices are alternately connected in series. The semiconductor devices are formed using BiTe, for example.

The laser support member 4 is provided on the upper surface of the support member 18. On the upper surface of the laser support member 4, the semiconductor laser device 5 is placed. The laser support member 4 is formed using a material such as aluminum oxide, aluminum nitride, copper tungsten, silicon carbide, silicon, copper, or diamond. The laser support member 4 is more preferably formed using a material having a high thermal conductivity.

The semiconductor laser device 5 emits laser light L1 toward one end side in the package 2. The semiconductor laser device 5 emits the laser light L1 and laser light L2 in accordance with driving currents supplied from the controller (not illustrated). In the first embodiment, the side toward which the semiconductor laser device 5 emits the laser light L1 is described as a rear side while the side toward which the semiconductor laser device 5 emits the laser light L2 is described as a front side in the package 2.

The collimating lens 6 collimates the laser light L1 emitted from the semiconductor laser device 5 and outputs the collimated laser light L1 to the beam splitter 7.

The beam splitter 7 allows part of the laser light L1 collimated by the collimating lens 6 to pass therethrough to the PD 13 while the beam splitter 7 reflects the rest of laser light L1 to the mirror 8.

The mirror 8 reflects the laser light L1 reflected by the beam splitter 7 to the optical isolator 9.

The optical isolator 9 is bonded to the upper surface of the support member 18 with an adhesive (not illustrated) or resin, for example. The optical isolator 9 includes a permanent magnet. The optical isolator 9 allows the laser light L1 reflected by the mirror 8 to pass therethrough to the condenser lens 10 while the optical isolator 9 blocks light entering from the condenser lens 10 side. The optical isolator 9 is formed such that an optical axis shift of the laser light L1 caused by the optical isolator 9 and a refraction direction of the laser light L1 caused by the condenser lens 10 are opposite to each other. Specifically, an incident end face, on which the laser light L1 is incident, of the optical isolator 9 is formed such that the incident end face is tilted with respect to the laser light L1. The permanent magnet of the optical isolator 9 is made of a material such as samarium cobalt, neodymium, or ferrite.

The condenser lens 10 condenses the laser light L1 having passed through the optical isolator 9 to couple the laser light L1 to the optical fiber 11. In the first embodiment, the structure including the collimating lens 6, the beam splitter 7, the mirror 8, the optical isolator 9, and the condenser lens 10 functions as a turn-back unit that turns back the laser light L1 toward the other end side in the package 2 in the opposite direction of the emission direction in which the semiconductor laser device 5 emits the laser light L1, and emits the laser light L1 to the incident end of the optical fiber 11.

The optical fiber 11 is provided in the package 2 in such a manner that the incident end on which the laser light L1 is incident faces the other end side in the package 2 that is in the opposite direction of the emission direction in which the semiconductor laser device 5 emits the laser light L1. The optical fiber 11 is provided by being inserted in the package 2. The optical fiber 11 propagates the laser light L1 coupled thereto by the condenser lens 10. The fiber holder 12 holds the optical fiber 11.

The PD 13 receives the laser light L1 having passed through the beam splitter 7 and outputs a current signal according to the received optical power to the controller (not illustrated). The controller (not illustrated) controls the driving current supplied to the semiconductor laser device 5 on the basis of the current signal received from the PD 13. For example, the controller (not illustrated) controls the driving current supplied to the semiconductor laser device 5 such that the current signal received from the PD 13 maintains a fixed value. As a result, the controller (not illustrated) can control the optical output of the semiconductor laser device 5 constant.

The coupling lens 14 is placed on the upper surface of the temperature regulator 3 on the front side opposite to the emission side toward which the semiconductor laser device 5 emits the laser light L1 in the package 2. The coupling lens 14 couples the laser light L2 output from the semiconductor laser device 5 to the wavelength detection element 15.

The wavelength detection element 15 includes at least a light branching section (not illustrated) and a filter section (not illustrated). The light branching section branches the laser light L2 and inputs one branched laser light to the PD 16. The filter section, which has a transmission characteristic at periodic light frequency, transmits the other branched laser light branched by the light branching section and inputs the laser light after transmission to the PD 17.

Each of the PDs 16 and 17 receives the corresponding laser light and outputs a current signal according to the received optical power to the controller (not illustrated). The controller (not illustrated) controls the driving current supplied to the temperature regulator 3 on the basis of the current signals received from the PDs 16 and 17. As a result, the controller adjusts the temperature of the semiconductor laser device 5 to control the wavelength of the laser light L1 output by the semiconductor laser device 5. Such control is a known technique called wavelength locking. The wavelength detection element 15 can be achieved by an optical waveguide element such as a planar lightwave circuit (PLC) or a space coupling system. The filter section can be achieved by a ring filter or an etalon filter, for example. When the wavelength detection element 15 is achieved by the space coupling system, for example, the coupling lens 14 is replaced with a collimating lens.

The support member 18 is provided on the upper surface of the temperature regulator 3. On the upper surface of the support member 18, the laser support member 4, the collimating lens 6, the beam splitter 7, the mirror 8, the optical isolator 9, the condenser lens 10, the fiber holder 12, the PD 13, the coupling lens 14, the wavelength detection element 15, the PD 16, and the PD 17 are placed. The support member 18 is formed using a material such as aluminum oxide, aluminum nitride, copper tungsten, silicon carbide, silicon, copper, or diamond. The support member 18 is more preferably formed using a material having a high thermal conductivity.

The lid portion 19, which has a rectangular shape, is mounted on the package 2 and hermetically sealed. The lid portion 19 has a main body portion 191 that is in contact with the upper end portion of a sidewall 21 of the package 2 when the lid portion 19 is mounted on the package 2, and a thick portion 192 that is provided on a lower surface side of the main body portion 191. In FIGS. 1 and 2, the two portions denoted as 192 are the thick portion 192 as a whole. The thick portion can increase a strength of the lid portion 19 and can be used as a positioning portion that determines the position of the lid portion 19 with respect to the package 2. The main body portion 191 and the thick portion 192 are formed integrally. The main body portion 191 and the thick portions 192 are formed integrally using Kovar, for example.

The thick portion 192 is formed such that the length in a short side direction and the length in a long side direction of the thick portion 192 are shorter than that in the short side direction and that in the long side direction of the main body portion 191, respectively. The thick portion 192 is formed such that the length in the short side direction and the length in the long side direction of the thick portion 192 are substantially the same as that in the short side direction and that in the long side direction on the inner side of the sidewall 21 of the package 2, respectively. As illustrated in FIGS. 1 and 2, the thick portion 192 is provided on the lower surface side other than a lower surface region R1 of the main body portion 191, the lower surface region R1 being directly above the optical isolator 9 housed in the package 2. Specifically, regarding the thick portion 192, when the lid portion 19 is mounted on the package 2, the shortest distance D1 from the upper surface of the optical isolator 9 to the lower surface of the thick portion 192 is equal to or larger than 0.8 mm. In addition, the thick portion 192 is formed such that a normal line distance X1 satisfies 0.8 mm≤X1 mm≤T1 mm+0.8 mm where the thick portion 192 has a thickness of T1 mm and the normal line distance from the lower surface of the lid portion 19 to the upper surface of the optical isolator 9 is X1 mm. The thick portion 192 determines the position of the lid portion 19 by being in contact with the inner surface side of the sidewall 21 in the package 2 when the lid portion 19 is mounted on the package 2. This structure allows the optical isolator 9 to make the magnetic force strength smaller than the adhesive strength of the adhesive, thereby preventing the optical isolator 9 from sticking to the lid portion 19. As a result, the optical isolator 9 is reliably prevented from being separated from the support member 18.

The first embodiment thus described above can downsize the package 2 in the long side direction.

In the first embodiment, the optical isolator 9 is formed such that the light axis shift of the laser light L1 and the refraction direction of the laser light L1 caused by the condenser lens 10 are opposite to each other. As a result, the first embodiment can prevent an increase in size of the package 2 in the long side direction.

In the first embodiment, the wavelength detection element 15 is disposed on the other end side opposite to the emission end from which the semiconductor laser device 5 emits the laser light L1, and the semiconductor laser device 5 is disposed such that the rear end surface of the semiconductor laser device 5 is further on the inner side of the package 2 than the front end surface of the semiconductor laser device 5. As a result, this structure makes it possible to dispose the semiconductor laser device 5 serving as a heat generation source at the center in the package 2 in both directions parallel to and perpendicular to the insertion direction of the optical fiber 11, thereby allowing the temperature regulator 3 to more efficiently take in heat than a case where the heat generation source is disposed on the end of the package 2. Consequently, the first embodiment can reduce power consumption.

In the first embodiment, the thick portion 192 is disposed on the lower surface side other than the lower surface region R1 of the main body portion 191, the lower surface region R1 being directly above the optical isolator 9. This structure can prevent the optical isolator 9 from being separated from the support member 18.

Second Embodiment

The following describes a second embodiment. In the first embodiment, laser light is guided from the semiconductor laser device 5 to the incident end of the optical fiber 11 by being turned back in a substantially U-shape. In the second embodiment, laser light is guided in a substantially V-shape. In the following description, the same structure as that in the first embodiment is labeled with the same numeral and detailed description thereof is omitted.

Semiconductor Laser Module

Figure 3:
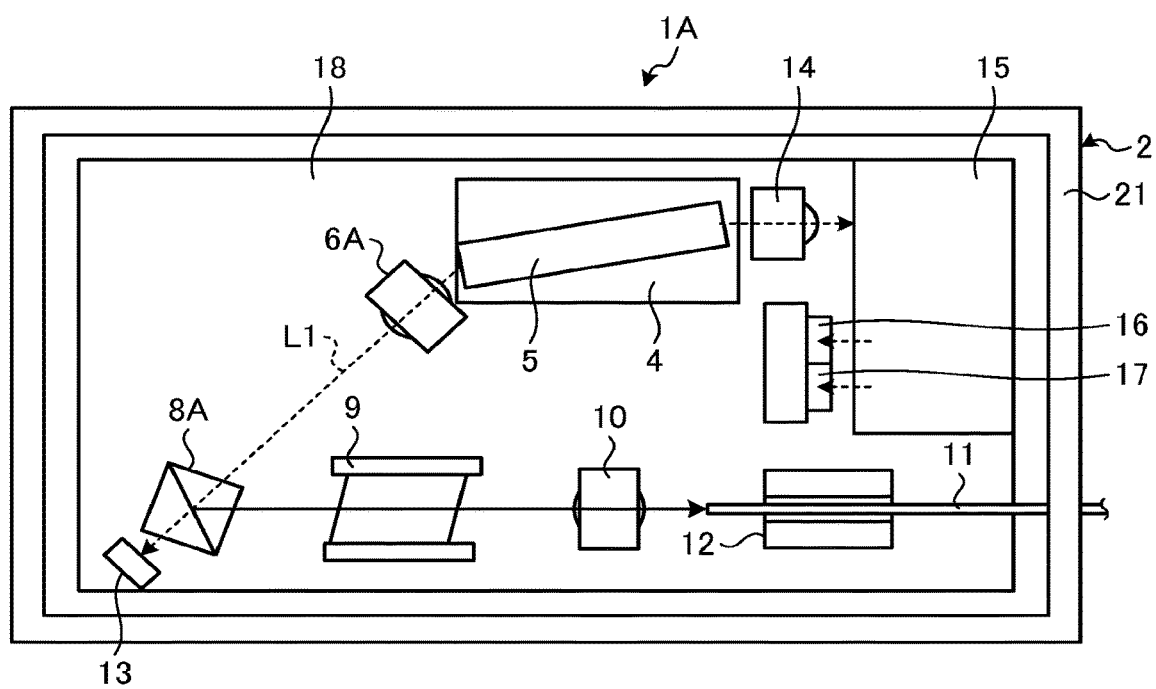
FIG. 3 is a plan view schematically illustrating a structure of a semiconductor laser module according to a second embodiment.

FIG. 3 is a plan view schematically illustrating a structure of a semiconductor laser module according to the second embodiment. In a semiconductor laser module 1A illustrated in FIG. 3 differs from the first embodiment in that the beam splitter 7 is omitted, and the mirror 8 is changed to a beam splitter 8A. Specifically, the semiconductor laser module 1A includes the package 2, the temperature regulator 3, the laser support member 4, a semiconductor laser device 5A, a collimating lens 6A, the beam splitter 8A, the optical isolator 9, the condenser lens 10, the optical fiber 11, the fiber holder 12, the PD 13, the coupling lens 14, the wavelength detection element 15, the PD 16, the PD 17, and the support member 18. The package 2 is provided with the lid portion 19 (not illustrated) in the first embodiment. The semiconductor laser module 1A is illustrated in a state where the lid portion 19 is removed for explaining the internal structure of the semiconductor laser module 1A.

The semiconductor laser device 5A, which is on one end side in the package 2, emits the laser light L1 toward the collimating lens 6A. The semiconductor laser device 5A outputs the laser light L1 and laser light L2 in accordance with the driving currents supplied from the controller (not illustrated).

The collimating lens 6A is disposed on an optical path of the laser light L1 between the semiconductor laser device 5A and the beam splitter 8A. The collimating lens 6A collimates the laser light L1 output from the semiconductor laser device 5A and outputs the collimated laser light L1 to the beam splitter 8A.

The beam splitter 8A allows part of the laser light L1 collimated by the collimating lens 6A to pass therethrough to the PD 13 while the beam splitter 8A reflects the laser light L1 to the optical isolator 9.

The second embodiment thus described above has the same effect as the first embodiment and can omit the mirror 8 included in the first embodiment, thereby making it possible to achieve lower cost than the first embodiment.

First Modification of First and Second Embodiments

The following describes a first modification of the first and the second embodiments. In the first modification of the first and the second embodiments, a lid portion has a different structure from that of the lid portion 19 according to the first and the second embodiments. The following describes only the lid portion according to the first modification of the first and the second embodiments.

Figure 4:
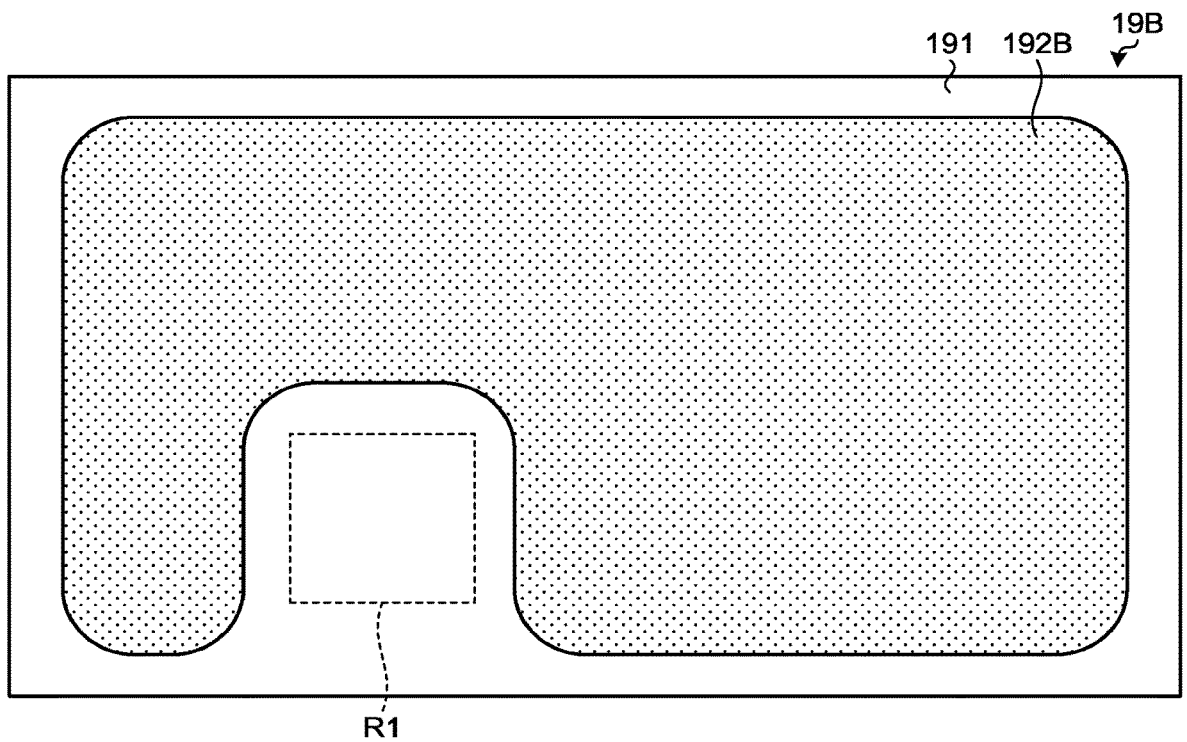
FIG. 4 is a plan view of a lid portion according to a first modification of the first and the second embodiments.

FIG. 4 is a plan view of the lid portion according to the first modification of the first and the second embodiments when viewed from the rear side. A lid portion 19B illustrated in FIG. 4 has a thick portion 192B instead of the thick portion 192 according to the first embodiment. The thick portion 192B is provided on the lower surface side other than the lower surface region R1 of the main body portion 191, the lower surface region R1 being directly above the optical isolator 9 housed in the package 2. The thick portion 192B is formed such that the thick portion 192B is in contact with an inner side of the sidewall 21 of the package 2 at at least four corners of the sidewall 21.

The first modification of the first and the second embodiments thus described above can prevent the optical isolator 9 from being separated from the support member 18.

Second Modification of First and Second Embodiments

The following describes a second modification of the first and the second embodiments. In the second modification of the first and the second embodiments, a lid portion has a different structure from that of the lid portion 19 according to the first and the second embodiments. The following describes only the lid portion according to the second modification of the first and the second embodiments.

Figure 5:
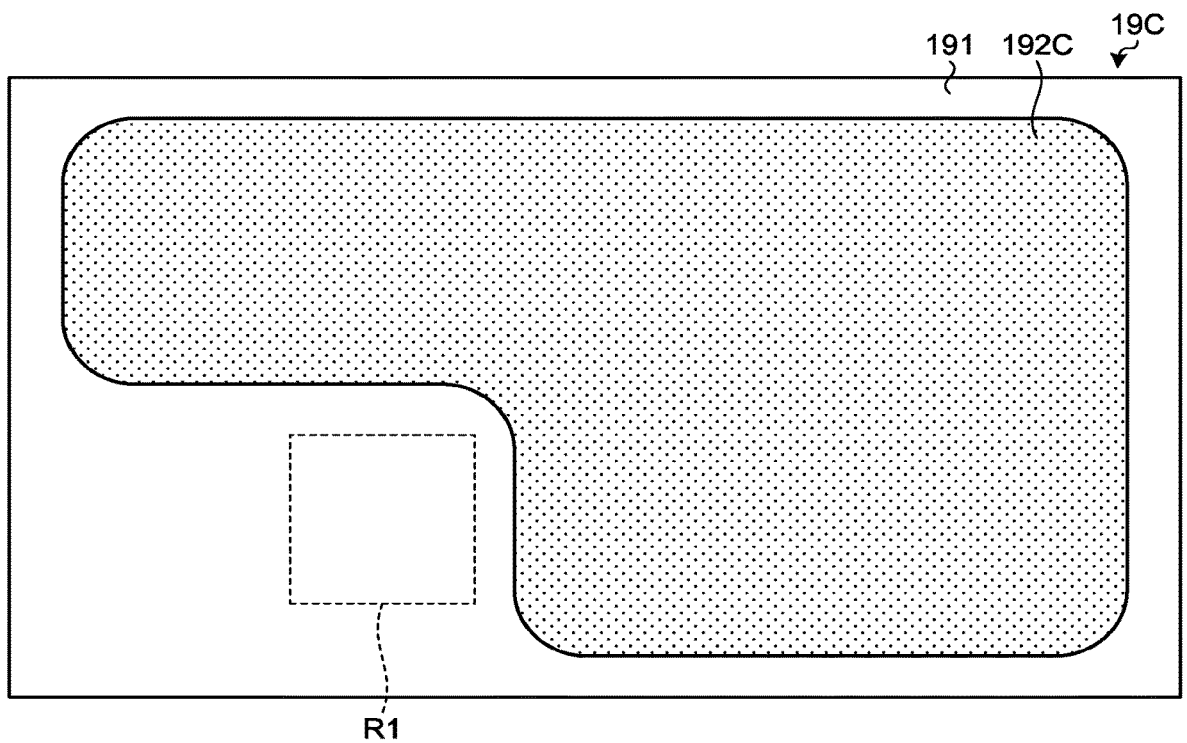
FIG. 5 is a plan view of a lid portion according to a second modification of the first and the second embodiments.

FIG. 5 is a plan view of the lid portion according to the second modification of the first and the second embodiments when viewed from the rear side. A lid portion 19C illustrated in FIG. 5 has a thick portion 192C instead of the thick portion 192 according to the first embodiment. The thick portion 192C is provided on the lower surface side other than the lower surface region R1 of the main body portion 191, the lower surface region R1 being directly above the optical isolator 9 housed in the package 2. The thick portion 192C is formed such that the thick portion 192C is in contact with the inner side of the sidewall 21 of the package 2 at at least three or more corners of the four corners of the sidewall 21.

The second modification of the first and the second embodiments thus described above can prevent the optical isolator 9 from being separated from the support member 18.

Third Modification of First and Second Embodiments

The following describes a third modification of the first and the second embodiments. In the third modification of the first and the second embodiments, a lid portion has a different structure from that of the lid portion 19 according to the first and the second embodiments. The following describes only the lid portion according to the third modification of the first and the second embodiments.

Figure 6:
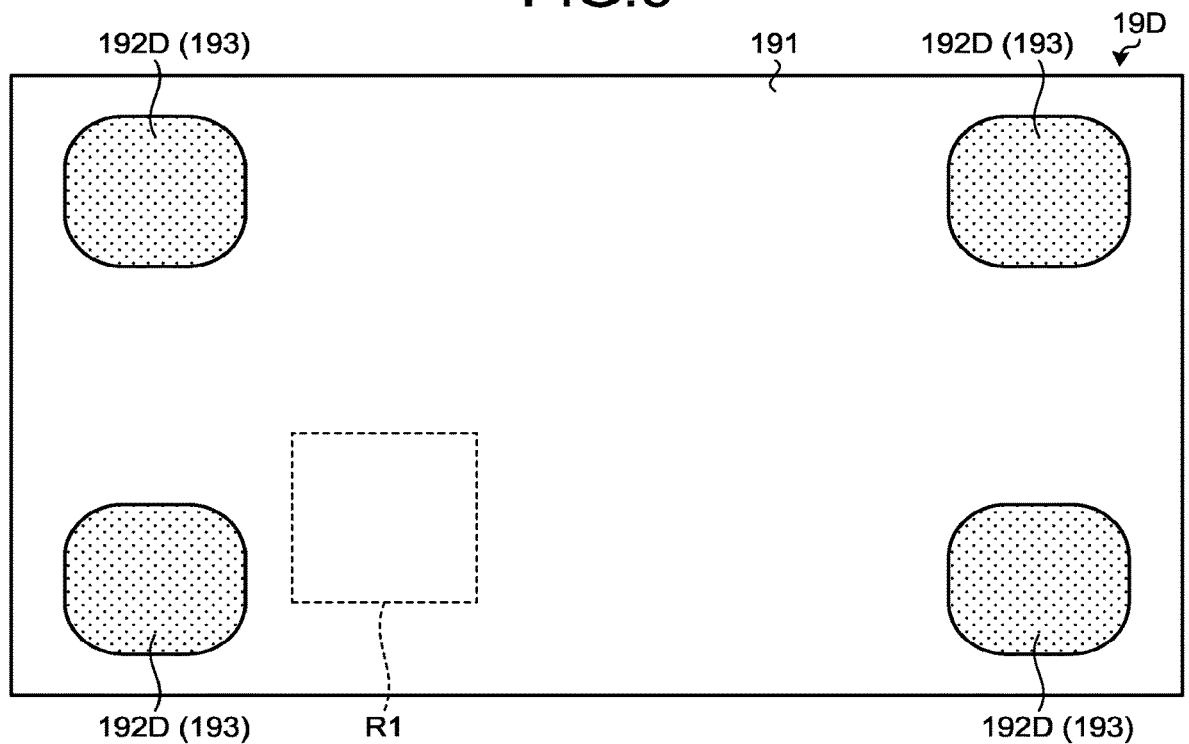
FIG. 6 is a plan view of a lid portion according to a third modification of the first and the second embodiments.

FIG. 6 is a plan view of the lid portion according to the third modification of the first and the second embodiments when viewed from the rear side. A lid portion 19D illustrated in FIG. 6 has a thick portion 192D instead of the thick portion 192 according to the first embodiment. In FIG. 6, four portions denoted as 192D are the thick portion 192D as a whole. The thick portion 192D is provided on the lower surface side other than the lower surface region R1 of the main body portion 191, the lower surface region R1 being directly above the optical isolator 9 housed in the package 2. The thick portion 192D has a plurality of protrusions 193 that are formed on the main body portion 191 and are in contact with the inner side of the sidewall 21 of the package 2 at at least the four corners of the sidewall 21. The protrusions 193 are formed on the main body portion 191 such that they are apart from one another.

The third modification of the first and the second embodiments thus described above can prevent the optical isolator 9 from being separated from the support member 18.

Fourth Modification of First and Second Embodiments

The following describes a fourth modification of the first and the second embodiments. In the fourth modification of the first and the second embodiments, a lid portion has a different structure from that of the lid portion 19 according to the first and the second embodiments. The following describes only the lid portion according to the fourth modification of the first and the second embodiments.

Figure 7:
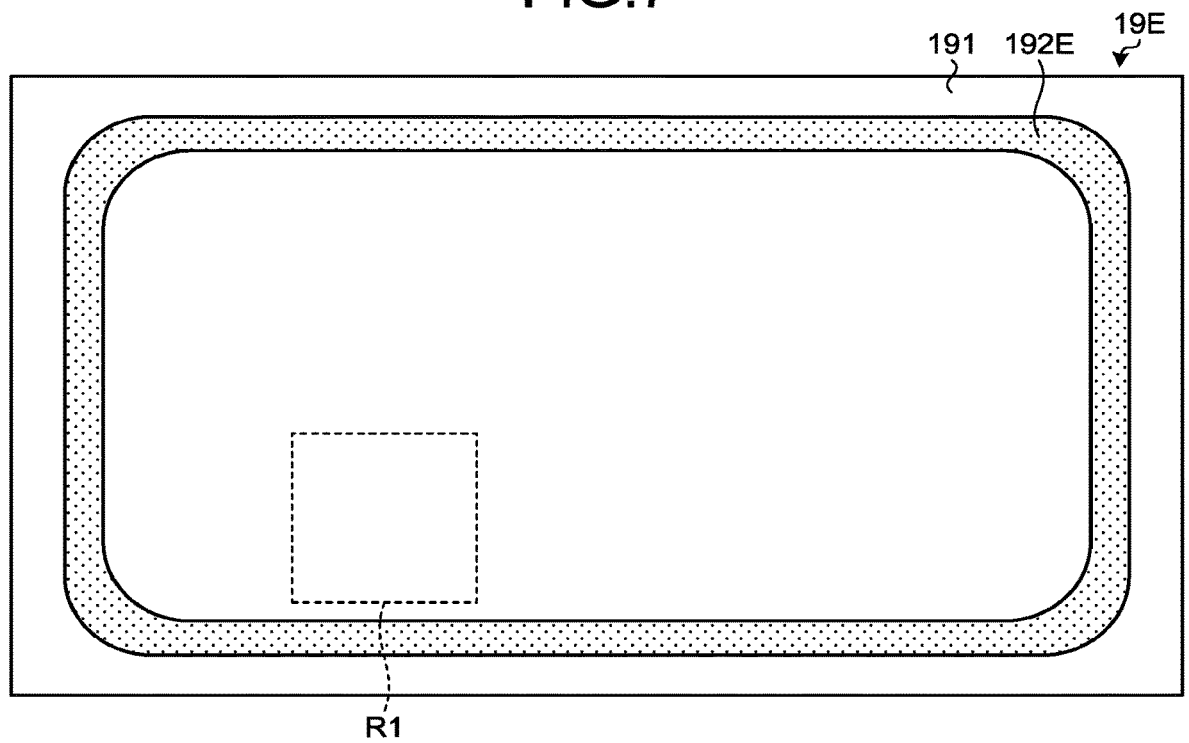
FIG. 7 is a plan view of a lid portion according to a fourth modification of the first and the second embodiments.

FIG. 7 is a plan view of the lid portion according to the fourth modification of the first and the second embodiments when viewed from the rear side. A lid portion 19E illustrated in FIG. 7 has a thick portion 192C instead of the thick portion 192 according to the first embodiment. The thick portion 192E is provided on the lower surface side other than the lower surface region R1 of the main body portion 191, the lower surface region R1 being directly above the optical isolator 9 housed in the package 2. The thick portion 192E is formed in such an annular shape that the thick portion 192E is in contact with the inner side of the sidewall 21 of the package 2 at at least the four corners of the sidewall 21.

The fourth modification of the first and the second embodiments thus described above can prevent the optical isolator 9 from being separated from the support member 18.

Fifth Modification of First and Second Embodiments

Figure 8:
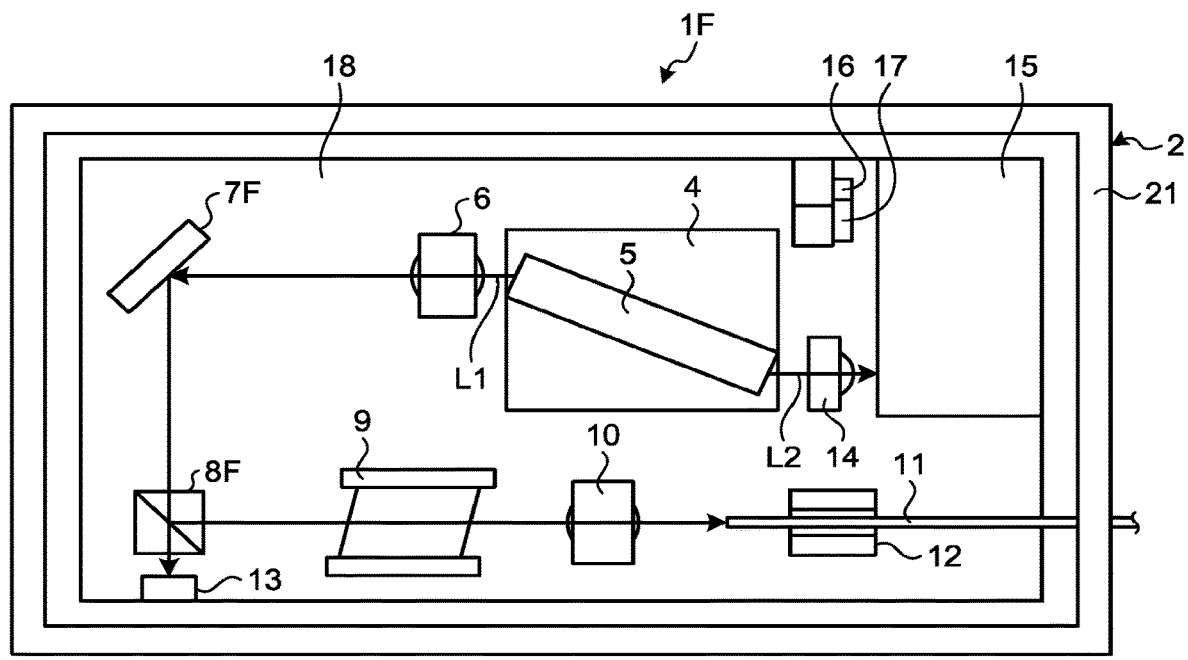
FIG. 8 is a plan view schematically illustrating a structure of a semiconductor laser module according to a fifth modification of the first and the second embodiments.

The following describes a fifth modification of the first and the second embodiments. FIG. 8 is a plan view schematically illustrating a structure of a semiconductor laser module according to the fifth modification of the first and the second embodiments. A semiconductor laser module 1F illustrated in FIG. 8 includes a beam splitter 8F and a mirror 7F instead of the beam splitter 7 and the mirror 8 in the first embodiment, respectively. In addition, the position of the PD 13 in the semiconductor laser module 1F differs from that of the PD 13 in the first embodiment. Specifically, the mirror 7F reflects the laser light L1 collimated by the collimating lens 6 to the beam splitter 8F. The beam splitter 8F allows part of the laser light L1 reflected by the mirror 7F to pass therethrough to the PD 13, and reflects the other part of the laser light L1 to the optical isolator 9.

The fifth modification of the first and the second embodiments thus described above can downsize the package 2 in the long side direction.

Sixth Modification of First and Second Embodiments

Figure 9:
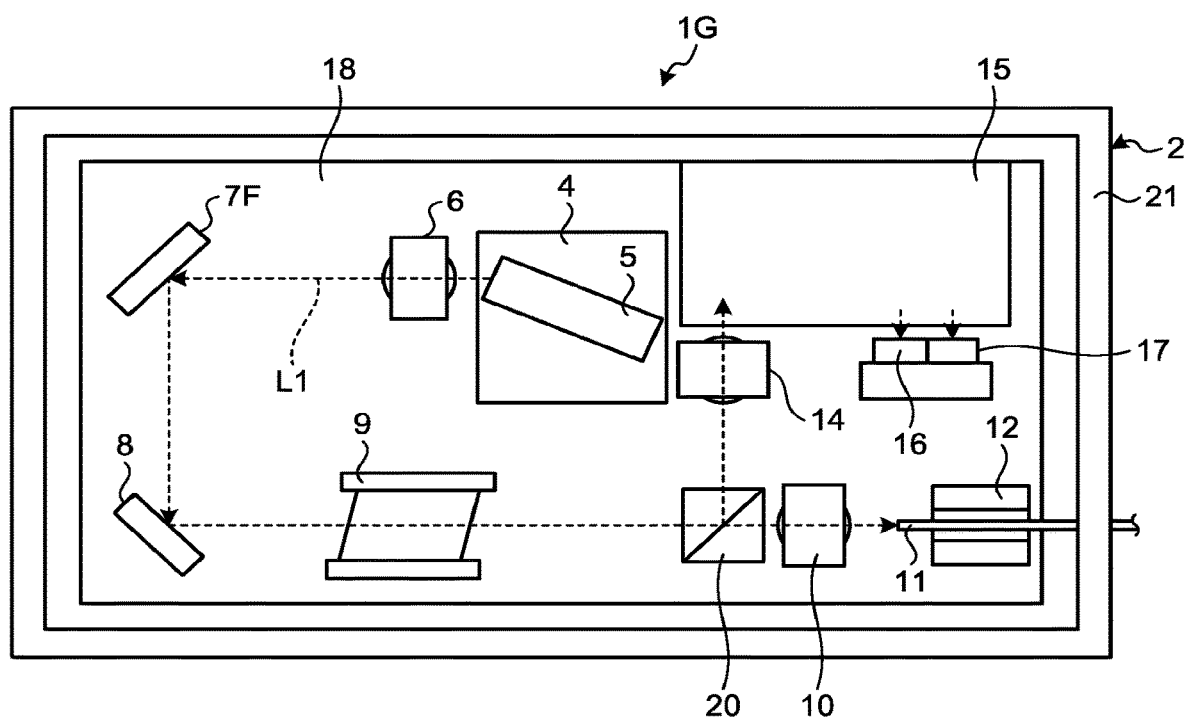
FIG. 9 is a plan view schematically illustrating a structure of a semiconductor laser module according to a sixth modification of the first and the second embodiments.

The following describes a sixth modification of the first and the second embodiments. FIG. 9 is a plan view schematically illustrating a structure of a semiconductor laser module according to the sixth modification of the first and the second embodiments. A semiconductor laser module 1G illustrated in FIG. 9 differs from the structure of the fifth modification of the first and the second embodiments in that the mirror 8 is included instead of the beam splitter 8F. The semiconductor laser module 1G further includes a beam splitter 20 that is disposed on the optical path between the optical isolator 9 and the condenser lens 10. In addition, in the semiconductor laser module 1G, the positions of the coupling lens 14, the wavelength detection element 15, the PD 16, and the PD 17 differ from those in the fifth modification of the first and the second embodiments. Specifically, the beam splitter 20 reflects part of the laser light L1 having passed through the optical isolator 9 to the coupling lens 14, and allows the other part of the laser light L1 to pass therethrough to the condenser lens 10.

The sixth modification of the first and the second embodiments thus described above can downsize the package 2 in the long side direction.

Seventh Modification of First and Second Embodiments

Figure 10:
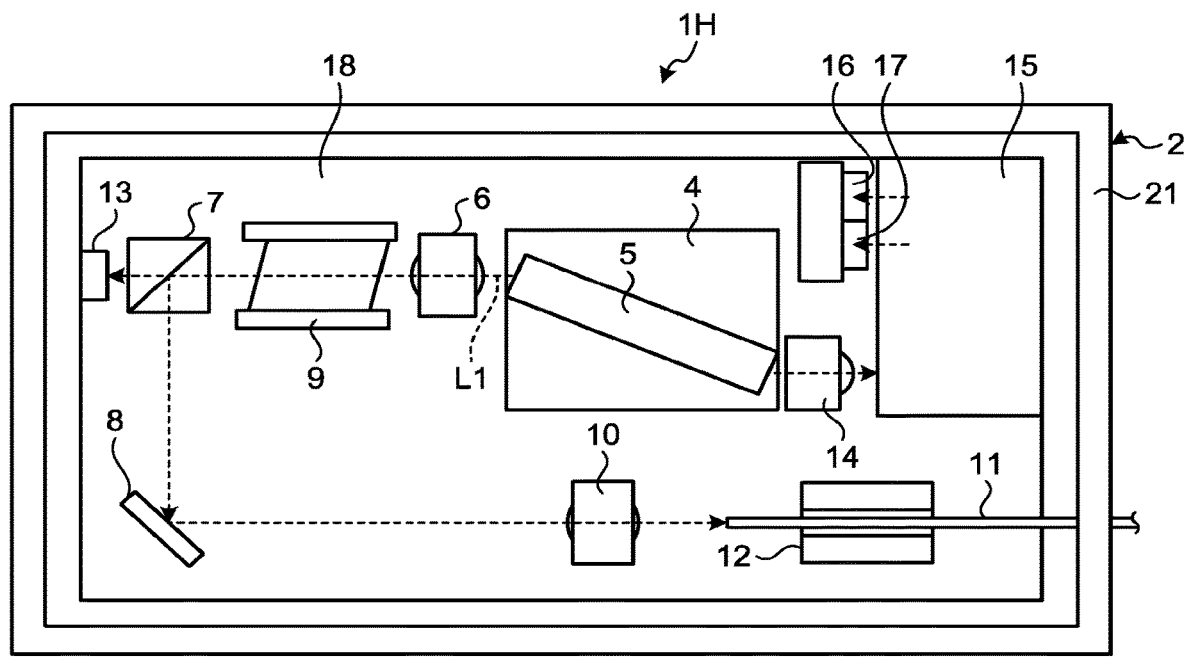
FIG. 10 is a plan view schematically illustrating a structure of a semiconductor laser module according to a seventh modification of the first and the second embodiments.

The following describes a seventh modification of the first and the second embodiments. FIG. 10 is a plan view schematically illustrating a structure of a semiconductor laser module according to the seventh modification of the first and the second embodiments. A semiconductor laser module 1H illustrated in FIG. 10 includes the optical isolator 9 disposed at a different position from that of the optical isolator 9 in the first embodiment. Specifically, as illustrated in FIG. 10, the optical isolator 9 is disposed on the optical path between the collimating lens 6 and the beam splitter 7.

The seventh modification of the first and the second embodiments thus described above can downsize the package 2 in the long side direction.

Eighth Modification of First and Second Embodiments

Figure 11:
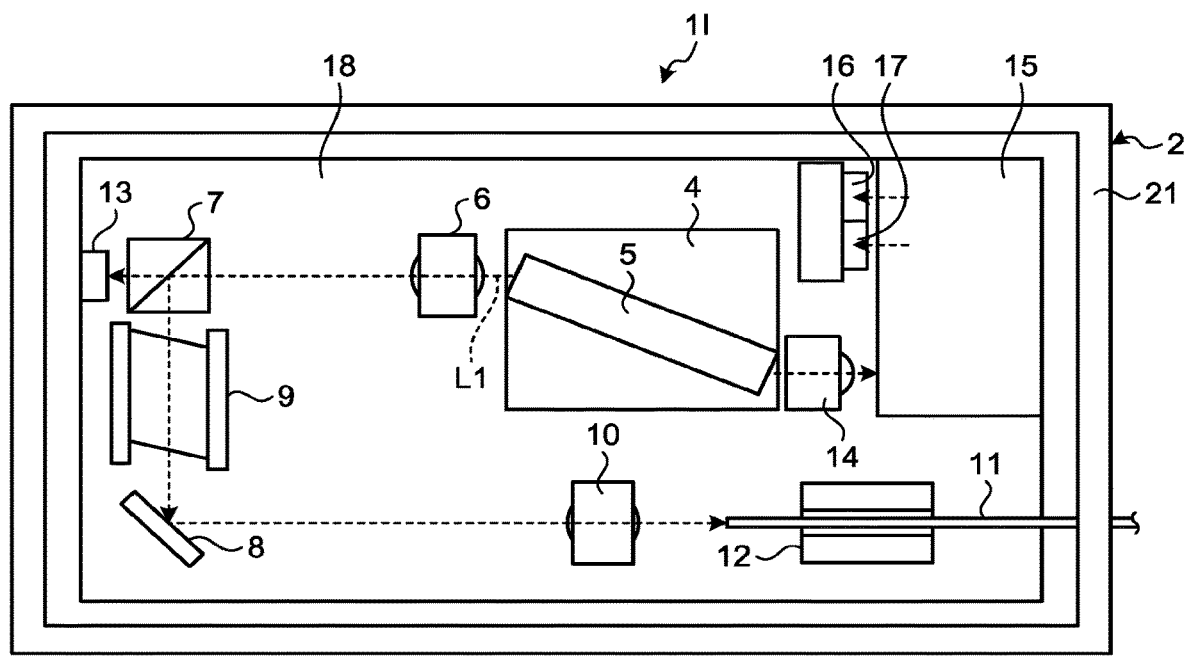
FIG. 11 is a plan view schematically illustrating a structure of a semiconductor laser module according to an eighth modification of the first and the second embodiments.

The following describes an eighth modification of the first and the second embodiments. FIG. 11 is a plan view schematically illustrating a structure of a semiconductor laser module according to the eighth modification of the first and the second embodiments. A semiconductor laser module 1I illustrated in FIG. 11 includes the optical isolator 9 disposed at a different position from that of the optical isolator 9 in the first embodiment. Specifically, as illustrated in FIG. 11, the optical isolator 9 is disposed on the optical path between the beam splitter 7 and the mirror 8.

The eighth modification of the first and the second embodiments thus described above can downsize the package 2 in the long side direction.

Ninth Modification of First and Second Embodiments

Figure 12:
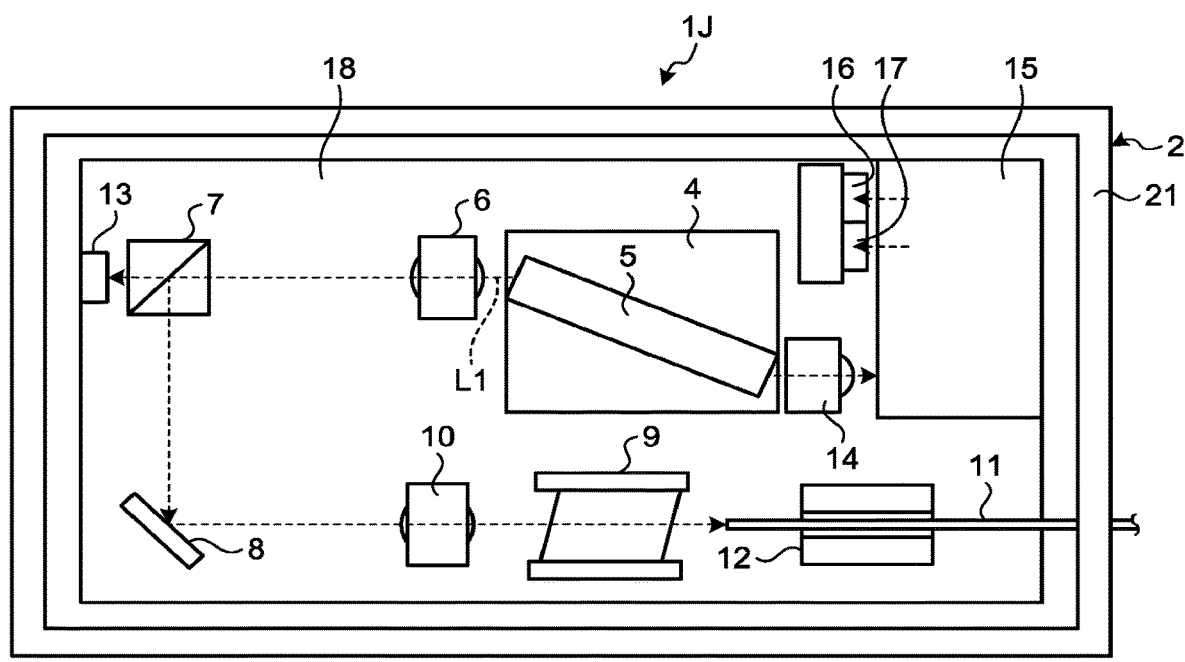
FIG. 12 is a plan view schematically illustrating a structure of a semiconductor laser module according to a ninth modification of the first and the second embodiments.

The following describes a ninth modification of the first and the second embodiments. FIG. 12 is a plan view schematically illustrating a structure of a semiconductor laser module according to a ninth modification of the first and the second embodiments. A semiconductor laser module 1J illustrated in FIG. 12 includes the optical isolator 9 disposed at a different position from that of the optical isolator 9 in the first embodiment. Specifically, as illustrated in FIG. 12, the optical isolator 9 is disposed on the optical path between the condenser lens 10 and the optical fiber 11.

The ninth modification of the first and the second embodiments thus described above can downsize the package 2 in the long side direction.

Tenth Modification of First and Second Embodiments

The following describes a tenth modification of the first and the second embodiments. In the tenth modification of the first and the second embodiments, a lid portion has a different structure from that of the lid portion 19 according to the first and the second embodiments. The following describes only the lid portion according to the tenth modification of the first and the second embodiments.

Figure 13:
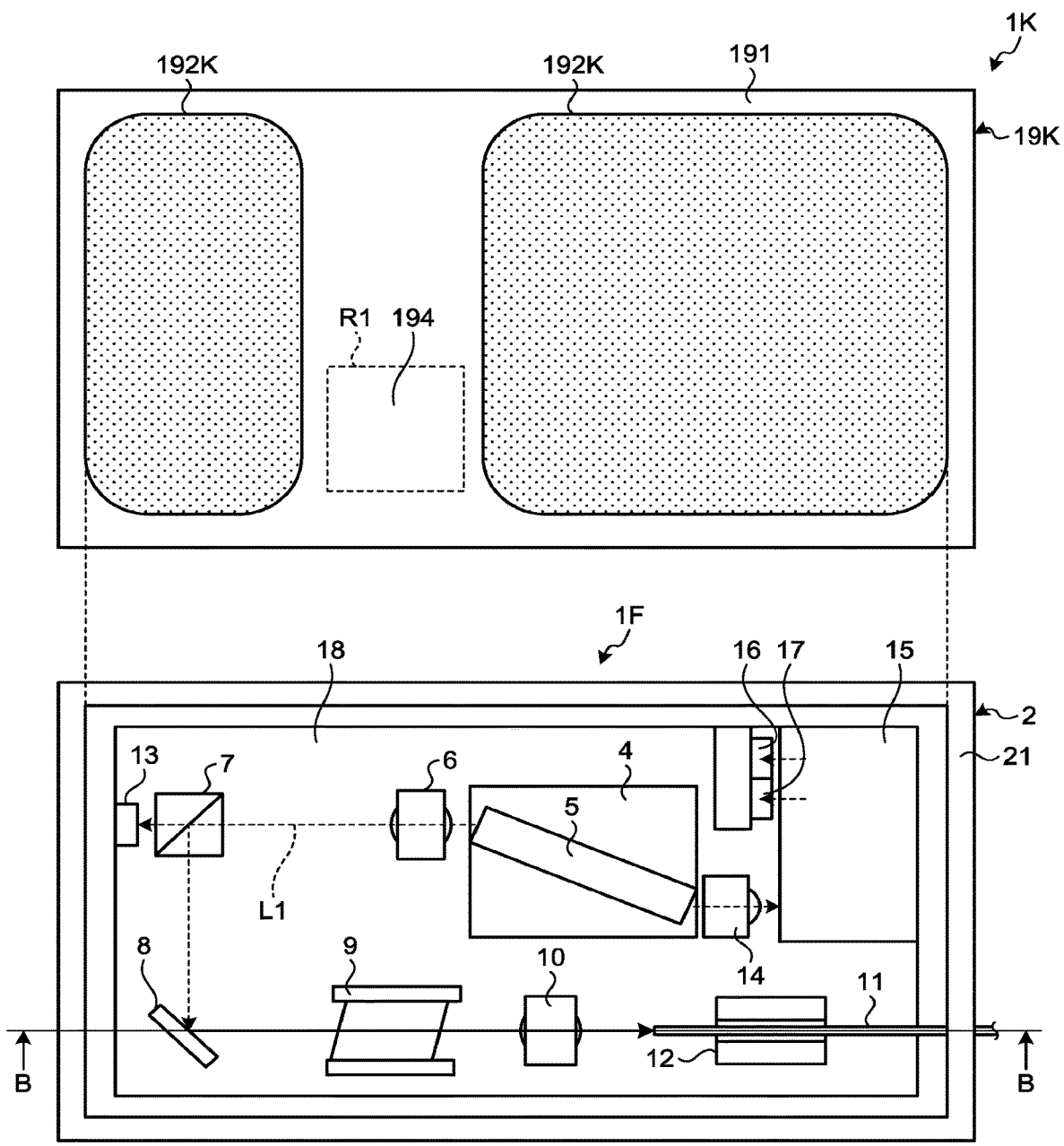
FIG. 13 is a plan view schematically illustrating a structure of a semiconductor laser module according to a tenth modification of the first and the second embodiments.
Figure 14:
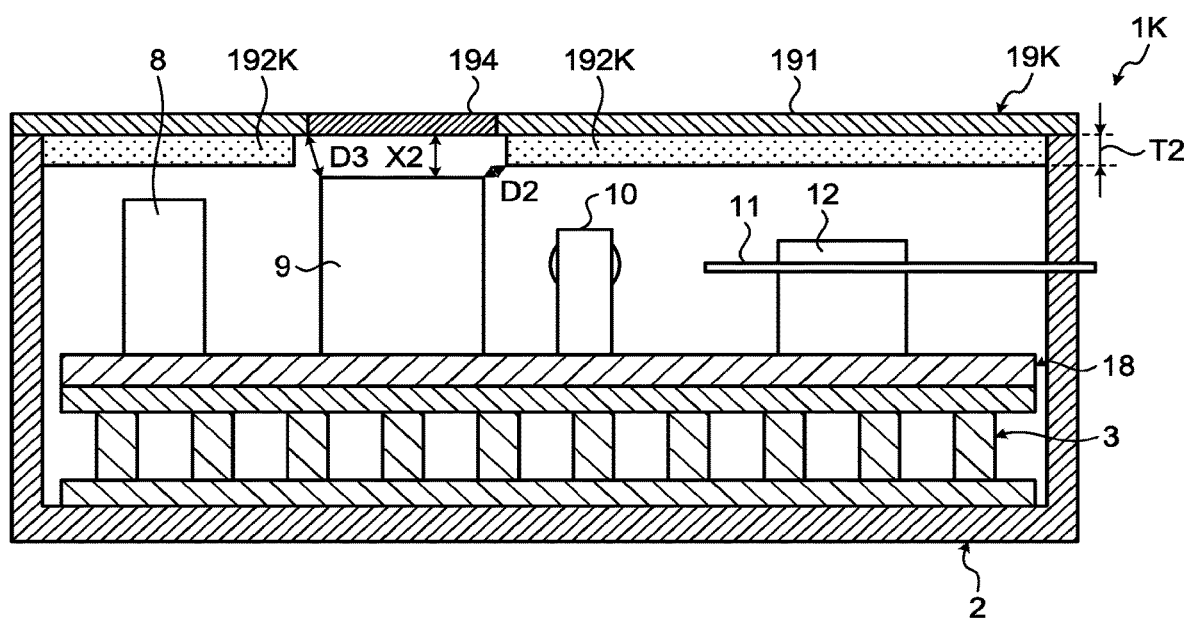
FIG. 14 is a cross-sectional view taken along line B-B in FIG. 13.

FIG. 13 is a plan view that schematically illustrates a structure of a semiconductor laser module according to the tenth modification of the first and the second embodiments, and illustrates the lid portion when viewed from the rear side. FIG. 14 is a cross-sectional view schematically illustrating a major part of the semiconductor laser module according to the tenth modification of the first and the second embodiments. This semiconductor laser module 1K illustrated in FIGS. 13 and 14 includes a lid portion 19K instead of the lid portion 19 of the semiconductor laser module 1 according to the first embodiment.

The lid portion 19K illustrated in FIGS. 13 and 14 has the main body portion 191, a thick portion 192K, and a region portion 194 formed in the main body portion 191. In FIGS. 13 and 14, the two portions denoted as 192K are the thick portion 192K as a whole. The region portion 194 is formed in a region of the main body portion 191 corresponding to the lower surface region R1, that is directly above the optical isolator 9 housed in the package 2, and at least a part of which has no thick portion 192K. The region portion 194 is formed of a material that is not attracted by magnets. Specifically, the region portion 194 is formed of a material such as glass or ceramics and formed integrally with the main body portion 191. The region portion 194 may be formed of metal that is not attracted by magnets. Examples of such metal include aluminum, copper, manganese, austenitic stainless steel (e.g., SUS 304), and brass.

The thick portion 192K is formed such that, when the lid portion 19K is mounted on the package 2, the shortest distance D2 from the optical isolator 9 to the thick portion 192K is equal to or larger than 0.8 mm, and a normal line distance X2 satisfies 0 mm≤X2 mm≤T2 mm+0.8 mm where the thick portion 192K has a thickness of T2 mm and the normal line distance from the lower surface of the lid portion 19K to the upper surface of the optical isolator 9 is X2 mm. When the thick portion 192K is formed as described above and the shortest distance D3 between the lid portion 19K outside the region portion 194 and the optical isolator is equal to or larger than 0.8 mm, the optical isolator 9 can make the magnetic strength smaller than the adhesive strength of the adhesive. As a result, the optical isolator 9 is prevented from sticking to the lid portion 19K. As a result, the optical isolator 9 is reliably prevented from being separated from the support member 18.

The tenth modification of the first and the second embodiments thus described above can prevent the optical isolator 9 from being separated from the support member 18.

The tenth modification of the first and the second embodiments allows the respective shapes of the thick portions 192B, 192C, 192D, and 192E in the first to the fourth modifications of the first and the second embodiments to be applied to the shape of thick portion 192K.

Other Embodiments

In the respective embodiments, the optical fiber 11 is disposed on one sidewall side in the short side direction of the package 2 apart from the center of the package 2 in the short side direction. This structure makes it possible to downsize the module in the long side direction without increasing in size of the module in the short side direction.

The present disclosure has an advantageous effect of capable of downsizing the package in the long side direction.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser module that includes a package accommodating therein a plurality of optical components, the semiconductor laser module comprising:
    a semiconductor laser device that emits laser light toward one end side in the package;
    an optical fiber having an incident end for receiving the laser light on another end side in the package, the another end side being opposite to the one end side toward which the semiconductor laser device emits the laser light;
    a turn-back unit that turns back the laser light toward the another end side in the package, the another end side being at the end opposite to an emission direction in which the semiconductor laser device emits the laser light, and outputs the laser light to the incident end of the optical fiber, the turn-back unit including:
    one or more reflection members,
    a collimating lens that collimates the laser light emitted by the semiconductor laser device and emits the collimated laser light to the one or more reflection members,
    a condenser lens that condenses the laser light reflected by the one or more reflection members to the incident end of the optical fiber, and
    an optical isolator that is disposed between two components of the one or more reflection members, the condenser lens, and the incident end of the optical fiber, the optical isolator including a permanent magnet and being bonded to an upper surface of a support member in the package with an adhesive; and
    a lid portion mounted on the package, the lid portion including:
    a main body portion that is in contact with an upper end portion of a sidewall of the package, and
    a thick portion that is provided on a lower surface of the main body portion and determines a position of the lid portion with respect to the package, the thick portion being provided on the lower surface other than a lower surface region of the main body portion, the lower surface region being directly above the optical isolator housed in the package when the lid portion is mounted on the package, a predetermined distance between the lower surface region of the main body portion and the optical isolator being configured in such a way that a magnetic force strength between the optical isolator and the lid portion caused by the permanent magnet is smaller than an adhesive strength of the adhesive for bonding the optical isolator to the upper surface of the support member in the package, thereby preventing the optical isolator from sticking to the lid portion.

2. The semiconductor laser module according to claim 1, wherein the optical isolator causes an optical axis of the laser light to shift when the laser light passes the isolator, the condenser lens refracts the laser light received from the optical isolator when the laser light passes the condenser lens, and the optical isolator and the condenser lens are disposed such that an optical axis shift direction of the laser light caused by the optical isolator and a refraction direction of the laser light caused by the condenser lens are opposite to each other.

3. The semiconductor laser module according to claim 1, further comprising a wavelength detection element that is disposed on the another end side and detects a wavelength of the laser light, the wavelength detection element being positioned at a first side of the semiconductor laser device opposite to a second side of the semiconductor laser device from which the semiconductor laser device emits the laser light.

4. The semiconductor laser module according to claim 1, wherein the optical fiber is inserted into the package.

5. The semiconductor laser module according to claim 1, further comprising a power monitor that receives a portion of the laser light and detects power of the laser light, wherein
    one of the one or more reflection members allows the portion of the laser to pass therethrough and reflects a rest of the laser light, and
    the power monitor is disposed at a position where the portion of the laser light after passing through the one of the one or more reflection members passes through and reach a light receiving surface of the power monitor.

6. The semiconductor laser module according to claim 1, further comprising a power monitor that receives a portion of the laser light and detects power of the laser light, wherein
    the turn-back unit includes:
        a first reflection member of the one or more reflection members that reflects the laser light;
        a second reflection member of the one or more reflection members that reflects the laser light reflected by the first reflection member to the incident end of the optical fiber; and
        a light branching unit that allows part of the laser light reflected by the second reflection member to pass therethrough and reflects a rest of the laser light reflected by the second reflection member; and
    the power monitor is disposed at a position where the laser light reflected by the light branching unit passes through and reach a light receiving surface of the power monitor.

7. The semiconductor laser module according to claim 1, wherein
    the optical isolator is disposed between the one or more reflection members and the collimating lens.

8. The semiconductor laser module according to claim 1, wherein the turn-back unit further includes:
    a first reflection member of the one or more reflection members that reflects the laser light; and
    a second reflection member of the one or more reflection members that reflects the laser light reflected by the first reflection member to the incident end of the optical fiber,
    wherein the optical isolator is disposed between the first reflection member and the second reflection member.

9. The semiconductor laser module according to claim 1, wherein
    the optical isolator that is disposed between the condenser lens and the incident end of the optical fiber.

10. The semiconductor laser module according to claim 1, wherein the thick portion is formed such that the thick portion is in contact with an inner side of the sidewall of the package at two or more portions of the sidewall.

11. The semiconductor laser module according to claim 1, wherein the optical fiber is disposed on one sidewall side in a short side direction of the package and apart from a center of the one sidewall side in the short side direction.

12. A semiconductor laser module that includes a package accommodating therein a plurality of optical components, the semiconductor laser module comprising:
   a semiconductor laser device that emits laser light toward one end side in the package;
   an optical fiber having an incident end for receiving the laser light on another end side in the package, the another end side being opposite to the one end side toward which the semiconductor laser device emits the laser light;
   a turn-back unit that turns back the laser light toward the another end side in the package, the another end side being at the end opposite to an emission direction in which the semiconductor laser device emits the laser light, and outputs the laser light to the incident end of the optical fiber, the turn-back unit including an optical isolator that includes a magnet and being bonded to an upper surface of a support member in the package with an adhesive; and
   a lid portion mounted on the package, the lid portion including:
      a main body portion that is in contact with an upper end portion of a sidewall of the package, and
      a thick portion that is provided on a lower surface of the main body portion and determines a position of the lid portion with respect to the package, the thick portion being provided on the lower surface other than a lower surface region of the main body portion, the lower surface region being directly above the optical isolator housed in the package when the lid portion is mounted on the package, a predetermined distance between the lower surface region of the main body portion and the optical isolator being configured in such a way that a magnetic force strength between the optical isolator and the lid portion caused by the magnet is smaller than an adhesive strength of the adhesive for bonding the optical isolator to the upper surface of the support member in the package, thereby preventing the optical isolator from sticking to the lid portion.

13. The semiconductor laser module according to claim 12, wherein the turn-back unit includes an optical isolator and a condenser lens that condenses the laser light passing the optical isolator to the incident end of the optical fiber, and
   the optical isolator causes an optical axis of the laser light to shift when the laser light passes the isolator, the condenser lens refracts the laser light received from the optical isolator when the laser light passes the condenser lens, and the optical isolator and the condenser lens are disposed such that an optical axis shift direction of the laser light caused by the optical isolator and a refraction direction of the laser light caused by the condenser lens are opposite to each other.

14. The semiconductor laser module according to claim 12, further comprising a wavelength detection element that is disposed on the another end side and detects a wavelength of the laser light, the wavelength detection element being positioned at a first side of the semiconductor laser device opposite to a second side of the semiconductor laser device from which the semiconductor laser device emits the laser light.

15. A semiconductor laser module that includes a package accommodating therein a plurality of optical components, the semiconductor laser module comprising:
   a semiconductor laser device that emits laser light toward one end side in the package;
   an optical fiber having an incident end for receiving the laser light on another end side in the package, the another end side being opposite to the one end side toward which the semiconductor laser device emits the laser light;
   a turn-back unit that turns back the laser light toward the another end side in the package, the another end side being at the end opposite to an emission direction in which the semiconductor laser device emits the laser light, and outputs the laser light to the incident end of the optical fiber; and
   a wavelength detection element that is disposed on the another end side and detects a wavelength of the laser light, the wavelength detection element being positioned at a first side of the semiconductor laser device opposite to a second side of the semiconductor laser device from which the semiconductor laser device emits the laser light, wherein
   the turn-back unit includes an optical isolator and a condenser lens that condenses the laser light passing the optical isolator to the incident end of the optical fiber, and
   the optical isolator causes an optical axis of the laser light to shift when the laser light passes the isolator, the condenser lens refracts the laser light received from the optical isolator when the laser light passes the condenser lens, and the optical isolator and the condenser lens are disposed such that an optical axis shift direction of the laser light caused by the optical isolator and a refraction direction of the laser light caused by the condenser lens are opposite to each other.

\* \* \* \* \*